United States Patent [19]

Luthier et al.

[11] Patent Number: 5,030,522

[45] Date of Patent: Jul. 9, 1991

[54] BLACK-COLORED COATING DEPOSITED ON A SUBSTRATE

[75] Inventors: Roland Luthier, Lausanne; Francis Lévy, St-Sulpice; Alain Mocellin, Le Mont-Sur-Lausanne, all of Switzerland

[73] Assignee: Asulab S.A., Bienne, Switzerland

[21] Appl. No.: 437,062

[22] Filed: Nov. 16, 1989

Related U.S. Application Data

[62] Division of Ser. No. 370,937, Jun. 23, 1989, Pat. No. 4,997,538.

[30] Foreign Application Priority Data

Jun. 24, 1988 [CH] Switzerland ................... 02434/88

[51] Int. Cl.$^5$ ................... B32B 9/00; C32C 14/06; C32C 14/34
[52] U.S. Cl. ................... 428/698; 204/192.15; 204/192.16; 204/192.26; 428/702
[58] Field of Search ................... 204/192.15, 192.16, 204/192.26, 192.28; 438/678, 702

[56] References Cited

U.S. PATENT DOCUMENTS

| | | | |
|---|---|---|---|
| 3,803,057 | 4/1974 | Wasa et al. | 252/518 |
| 4,098,956 | 7/1978 | Blickensderfer et al. | 428/627 |
| 4,634,635 | 1/1987 | Shiraishi | 428/446 |
| 4,714,660 | 12/1987 | Gates, Jr. | 428/698 |
| 4,758,280 | 7/1988 | Bergmann et al. | 106/286.4 |
| 4,883,574 | 11/1989 | dos Santos Pereina Ribeiro | 204/192.15 |

FOREIGN PATENT DOCUMENTS

| | | |
|---|---|---|
| 3728837 | 3/1988 | Fed. Rep. of Germany . |
| 2128858 | 10/1972 | France . |
| 2592063 | 6/1987 | France . |
| 2182950 | 5/1987 | United Kingdom . |

OTHER PUBLICATIONS

Wear Resistant Ti–Al–C–N–O Films Produced by Sputtering, O. Knotek et al. Report of 8th International Congress on Vacuum Metallurgy in Linz, Austria in 1985.

*Primary Examiner*—John F. Niebling
*Assistant Examiner*—William T. Leader
*Attorney, Agent, or Firm*—Sughrue, Mion, Zinn, Macpeak & Seas

[57] ABSTRACT

A cathodic sputtering operation using a target of a material containing titanium, aluminium, oxygen and nitrogen in an argon atmosphere is disclosed.

This sputtering operation gives rise to a layer containing the same elements as the target. The resulting layer is opague, has an attractive, deep and brilliant black color, adheres well to the substrate and is resistant to wear and corrosion. The physical structure of the layer is characterized by a transparent and insulating amorphous phase in which are dispersed a plurality of inclusions having a size on the order of nanometers.

4 Claims, No Drawings

BLACK-COLORED COATING DEPOSITED ON A SUBSTRATE

This is a divisional of Application No. 07/370,937, filed June 23, 1989, now U.S. Pat. No. 4,897,538.

It is frequently desired to deposit a black-coloured coating onto a substrate which is an object, the main or secondary function of which is decorative, such as a watch housing or watch wristlet.

A coating of this type generally has to be opaque so that the colour of the substrate on which it is deposited does not change its own black colour, it must adhere perfectly to this substrate and resist wear and corrosion or, at least, oxidation.

DESCRIPTION OF THE PRIOR ART

Various processes exist for depositing a coating of this type.

Thus, for example, French patent application No. FR- A-2 592 063 describes the formation of a black coating on a substrate disposed in a suitable chamber by means of a vapour phase deposition process of titanium with the addition of various gaseous elements which are successively introduced into the chamber in order to form several superimposed coatings having different compositions.

French patent application No. FR-A-2 592 882 describes a further process of the same type as the above-described process using, as underlying material a hard titanium alloy and comprising the addition into the chamber of various gaseous elements in specific proportions.

U.S. pat. No. 4,634,635 describes a still further process according to which a black coating, which does not contain any metal element, is deposited on a substrate at high temperature using a chemical vapour phase process.

These earlier processes are not well suited to industrial use because they have in common the fact that the layer deposited thereby is composed, at least in part, of one or several chemical elements present in the chamber in the form of a gas or vapour.

The chemical composition of this layer may thus be relatively variable since it is directly dependent on the concentration of the element or elements in this gas or this vapour, said concentration being very difficult to regulate exactly and to maintain absolutely constant during the entire depositing operation which can take several hours.

OBJECTS OF THE INVENTION

An object of the instant invention is thus to provide a process for depositing a black-coloured coating onto a substrate which is easier to carry out on an industrial scale than the previous processes, the chemical composition of this coating being, moreover accurately and simply determined in advance.

BRIEF SUMMARY OF THE INVENTION

This aim is achieved by the process according to the instant invention which comprises the preparation of a solid material containing titanium, aluminium, oxygen and nitrogen and a cathodic sputtering operation using a target of the said material, said cathodic sputtering being effected in the presence of said substrate and in a non-reactive gas atmosphere.

Another object of the instant invention is to provide an opaque coating having an attractive, deep and brilliant black colour which is easy to deposit on a substrate in an industrial scale, which adheres to this substrate very well and which has good wear and corrosion resistance.

This object is achieved by the claimed coating which contains titanium, aluminium, oxygen and nitrogen.

BRIEF DESCRIPTION OF THE INVENTION

Cathodic sputtering techniques are well known and will not be described here in detail. It suffices to recall that, depending on these techniques, the substrate which has to be covered by a layer is fixed in a sealed chamber, facing and in the proximity of a target generally containing at least a part of the elements intended to form the layer.

Once the target and the substrate have been fixed onto their supports, the chamber is closed and evacuated, at least partially, of the air which fills it. This chamber is then filled with a gas at a predetermined pressure.

Direct or alternating voltage is then applied between the substrate and the target in such a manner that an electric arc is struck and maintained between this target and this substrate.

If this voltage between the substrate and the target is direct, the latter must be of an electrically conductive material.

On the other hand, if this voltage is alternating, the target may also be of an electrically insulating material.

In both these cases, the electrical arc struck and maintained by this voltage ionizes the gas through which it passes and the ions thereby produced bombard the target violently, tearing therefrom atoms or molecules which then become deposited on the substrate.

If necessary, the substrate is maintained at a predetermined temperature by a cooling liquid which circulates inside its support.

It should be noted that the use of a target composed of an electrically conductive material presents an undeniable technical advantage because the apparatus which has to be used to effect cathodic sputtering under direct voltage is very much simpler than that which has to be used when this voltage is alternating.

The depositing process which is the object of the instant invention involves a cathodic sputtering operation such as that which has been briefly described above and its inventive nature resides in the fact that the target used during this operation contains all the elements which have to form the layer to be deposited, namely titanium, aluminium, oxygen and nitrogen, in proportions which will be specified below.

The gas present in the chamber during the cathodic sputtering therefore does not have to react chemically with these elements and its nature and its pressure do not influence the chemical composition of the deposited layer. This gas can therefore be an inert gas, such as argon or neon.

DETAILED DESCRIPTION OF THE INVENTION

The material of the above-mentioned target may be prepared in various ways.

It is, for example, possible to mix titanium oxide $TiO_2$ powder and aluminium nitride AlN powder in a molar ratio of 1.5 parts $TiO_2$ to 2 parts AlN, and to sinter this mixture by subjecting it for about one hour to a temperature of about 1,400° C. and a pressure of about 45 megapascals.

During this sintering process an exchange reaction occurs, according to the equation:

$$1.5\ TiO_2 + 2\ AlN \rightarrow Al_2O_3 + 1.5\ TiN + 0.25\ N_2.$$

The material that results from this sinter solid and has a very fine-crystalline metallographic structure. In addition, this material is electrically conductive since it contains titanium nitride TiN.

The material of the target mentioned hereinabove can also be prepared by mixing titanium nitride TiN powder and aluminium oxide $Al_2O_3$ powder in a molar ratio of 1.5 parts TiN and 1 part $Al_2O_3$, and subjecting this mixture to a sintering operation under the same conditions as in the first example hereinabove.

This sintering is not reactive and the solid material which results therefrom has a metallographic structure, the crystals of which are slightly larger than in the preceding example. Since this material includes titanium nitride TiN, it is also conductive.

It should be noted that, in the two above-mentioned examples, it is preferable, but not compulsory, to chose quantities of powder and to carry out sintering operations in such a manner that the solid body obtained immediately has the shape and dimensions required for the target used during the cathodic sputtering operation.

Another way of preparing the material of the target mentioned hereinabove consists simply in mixing titanium oxide $TiO_2$ powder and aluminium nitride AlN powder in the same proportions as in the first example hereinabove.

Of course the material resulting from this simple mixture of powders is not solid and, to use it as a target during the cathodic sputtering operation it is necessary to pour it into a suitable container which is then placed in the chamber in which this cathodic sputtering takes place. After this material has been poured into this container it is preferably compressed, cold, to increase its bulk density and to make its upper surface, which will be bombarded with ions during the cathodic sputtering, as flat as possible.

Unlike the two previous ones, the material prepared as just described is insulating because it does not contain titanium nitride TiN.

It has now been found that when a target made of one of the materials described hereinabove is used in a cathodic sputtering operation, an opaque layer is formed on the substrate placed in the sputtering chamber which has an attractive, brilliant black colour, this layer being moreover hard, wear and corrosion resistant and electrically conductive.

The conditions under which this cathodic sputtering must be conducted are not very critical. Set out below is a practical and non-limiting example of these conditions in an instance in which the substrate on which the layer is deposited is stainless steel and where the target used has been manufactured according to the first method described hereinabove, that is by means of reactive sintering of a mixture of titanium oxide $TiO_2$ and aluminium nitride AlN powders.

Residual pressure in the chamber before introduction of the gas less than 3. $10^{-6}$ millibar;

Gas introduced in the chamber: 99.999% pure argon at a pressure of 4. $10^{-2}$ millibar;

Voltage applied between the target and the substrate: alternating, peak to peak amplitude 1200 V, frequency 13.56 MHz;

Diameter of the target: 85 mm;

Distance between the target and the substrate: 70 mm;

Electrical power absorbed during the sputtering: 350 W;

Temperature of the substrate: maintained at 20° C. throughout the sputtering operation.

Moreover, before the actual cathodic sputtering operation, the stainless steel substrate is etched in a conventional manner by applying thereto for 10 minutes a negative voltage as compared to that of the target so as to establish an electrical discharge absorbing a power of 90 W.

Under these conditions, the thickness of the layer deposited on the substrate increases at a speed of approximately 9 nm per minute.

Analysis of this layer using an electronic microprobe has shown that it contains the four chemical elements present in the target, namely titanium, aluminium, oxygen and nitrogen.

The atomic concentration of these elements, measured during this analytical procedure, is as follows:

titanium: approximately 15%
aluminium: approximately 25%
oxygen: approximately 47%
nitrogen: approximately 13%

This analysis clearly shows that no other chemical element is present in this layer, at least not in any detectable amount.

Study of the physical structure of the layer indicates that this resembles a ceramic material having a transparent and insulating amorphous phase in which are dispersed very many inclusions of very small size which are responsible for the black colour of the layer and for its conductivity. Since the dimensions of these inclusions and the distances which separate them are of an order of size measured in nanometres, it has not yet been possible to determine their chemical composition and that of the amorphous phase.

As has already been mentioned, this layer is opaque, inasmuch as the colour of the substrate on which it is deposited in no way influences its own colour.

Chromatic analysis of the layer deposited under the above-mentioned conditions, in the manner prescribed by the International Lighting Commission, gives the following results:

$L^* = 35$ to 41;
$a^* = 1.7$ to 2.1;
$b^* = 0.7$ to 2.7.

These values are those of an attractive, deep, brilliant black colour.

In addition, the layer hereby obtained has been subjected to wear and abrasion tests which have yielded excellent results.

The process of the invention has also been used to deposit black layers on substrates other than stainless steel and/or by using targets prepared according to a different one of the methods described hereinabove. In all cases the results were similar to those which have been mentioned hereinabove.

We claim:

1. A black-coloured coating deposited on a substrate, said coating consisting essentially of titanium, aluminium, oxygen and nitrogen, wherein the physical structure of said coating is characterized by a transparent and insulating amorphous phase i which are dispersed a plurality of inclusions having a size on the order of nanometers, said inclusions imparting the black color to said coating.

2. A coating according to claim 1 wherein the atomic concentrations of titanium, aluminium, oxygen and nitrogen are as follows:
- titanium: 15% approx.
- aluminium: 25% approx.
- oxygen: 47% approx.
- nitrogen: 13% approx.

3. A coating according to claim 1, wherein the atomic concentration of aluminium is approximately 25%.

4. A coating according to claim 2 or 3, deposited on said substrate by a sputtering process which comprises preparing a material containing titanium, aluminium, oxygen and nitrogen and using a target of said material in a cathodic sputtering operation, said cathodic sputtering being effected in the presence of said substrate and in an inert gas atmosphere.

* * * * *